United States Patent
Matsunami et al.

(10) Patent No.: US 7,266,170 B2
(45) Date of Patent: Sep. 4, 2007

(54) SIGNAL GENERATING CIRCUIT, TIMING RECOVERY PLL, SIGNAL GENERATING SYSTEM AND SIGNAL GENERATING METHOD

(75) Inventors: Hiroyuki Matsunami, Tajimi (JP); Kouji Okada, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 928 days.

(21) Appl. No.: 10/114,457

(22) Filed: Apr. 3, 2002

(65) Prior Publication Data

US 2002/0190765 A1    Dec. 19, 2002

(30) Foreign Application Priority Data

May 11, 2001    (JP) .............................. 2001-141713

(51) Int. Cl.
*H03D 3/24*    (2006.01)
*H03L 7/06*    (2006.01)

(52) U.S. Cl. .................. 375/376; 327/147; 327/156

(58) Field of Classification Search ................ 375/355, 375/371, 373, 376; 327/146–148, 155, 156
See application file for complete search history.

(56) References Cited

U.S. PATENT DOCUMENTS 4,929,918 A * 5/1990 Chung et al. .................. 331/10
5,329,251 A * 7/1994 Llewellyn ....................... 331/2
5,659,586 A * 8/1997 Chun ........................... 375/355
5,663,945 A * 9/1997 Hayashi et al. ........... 369/47.35
6,255,858 B1 * 7/2001 Akiyama et al. .............. 327/12

FOREIGN PATENT DOCUMENTS

| JP | 10-112141 | 4/1998 |
|----|-----------|--------|
| JP | 11-55113  | 2/1999 |

* cited by examiner

*Primary Examiner*—David B. Lugo
(74) *Attorney, Agent, or Firm*—Arent Fox, LLP.

(57) ABSTRACT

A control signal that runs a control oscillator of a signal generation circuit that generates a write clock is taken as a reference signal. That reference signal is supplied to a signal generation circuit that generates a read clock. In the signal generation circuit that generates the read clock, there is no need to generate a reference signal within its own circuits, which makes it possible to supply it to a control oscillator by adding the error timing from reading out the signal against the supplied reference signal. In this way, no means for locking the read clock into the initial frequency is needed and neither is the time for locking the read clock to the initial frequency (lock up time). This makes it possible to reduce the size of the circuit and to reduce the signal read-out time.

11 Claims, 16 Drawing Sheets

TRADITIONAL CLOCK RECOVERY PLL

EXAMPLE OF A PHASE COMPARATOR

EXAMPLE OF A CHARGE PUMP

EXAMPLE OF A V-I CONVERTER $Io = Vi/R$

EXAMPLE OF AN ICO

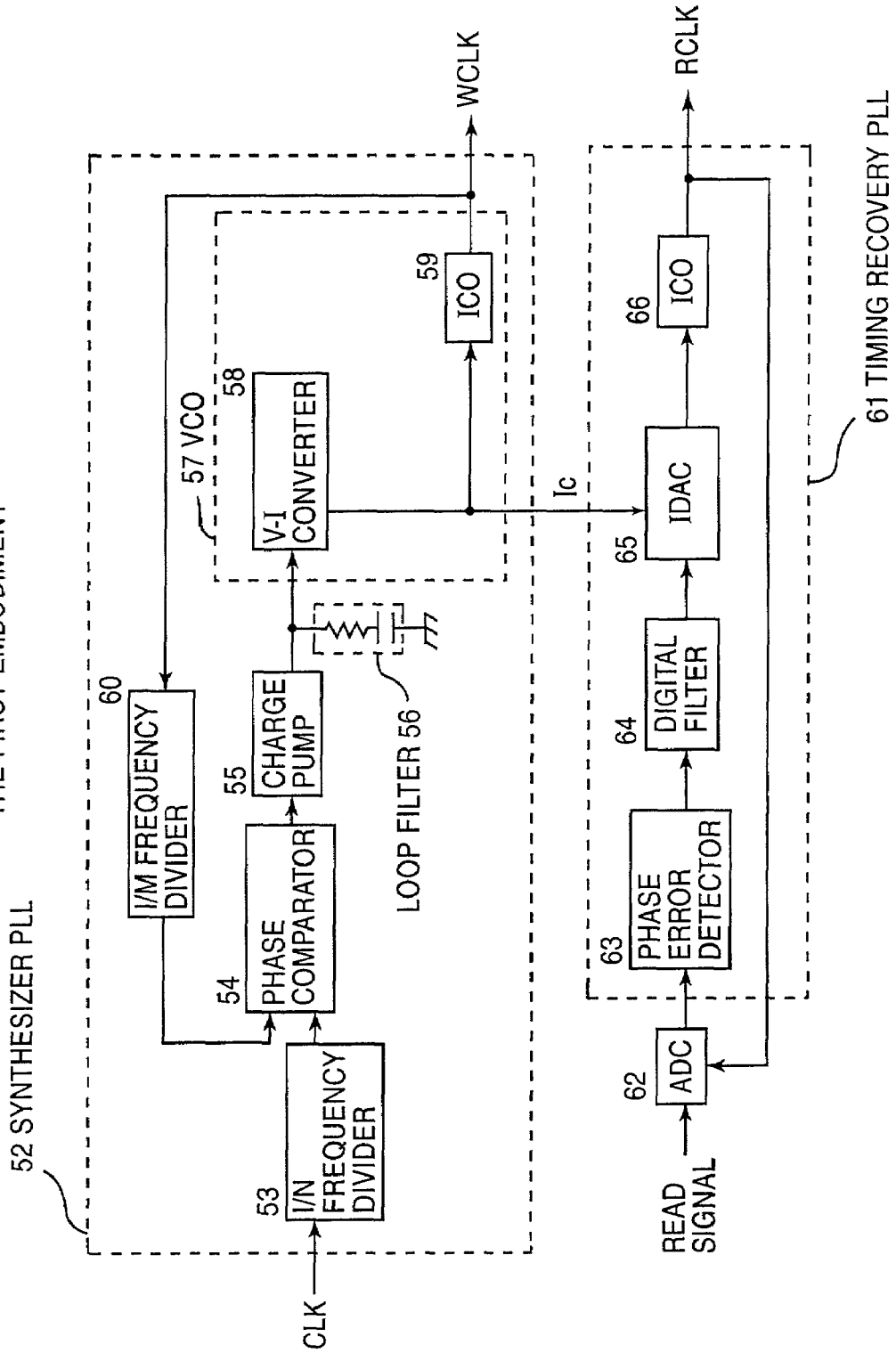

THE FIRST EMBODIMENT

ICO 59

THE FIRST EMBODIMENT

ICO 66

EXAMPLE OF IDAC

EXAMPLE OF A VCO

EXAMPLE OF A VDAC

FIG.12 THE THIRD EMBODIMENT

FIG. 13 THE FOURTH EMBODIMENT

THE FIFTH EMBODIMENT

EXAMPLE OF AN IDAC WITH A LPF

THE SIXTH EMBODIMENT

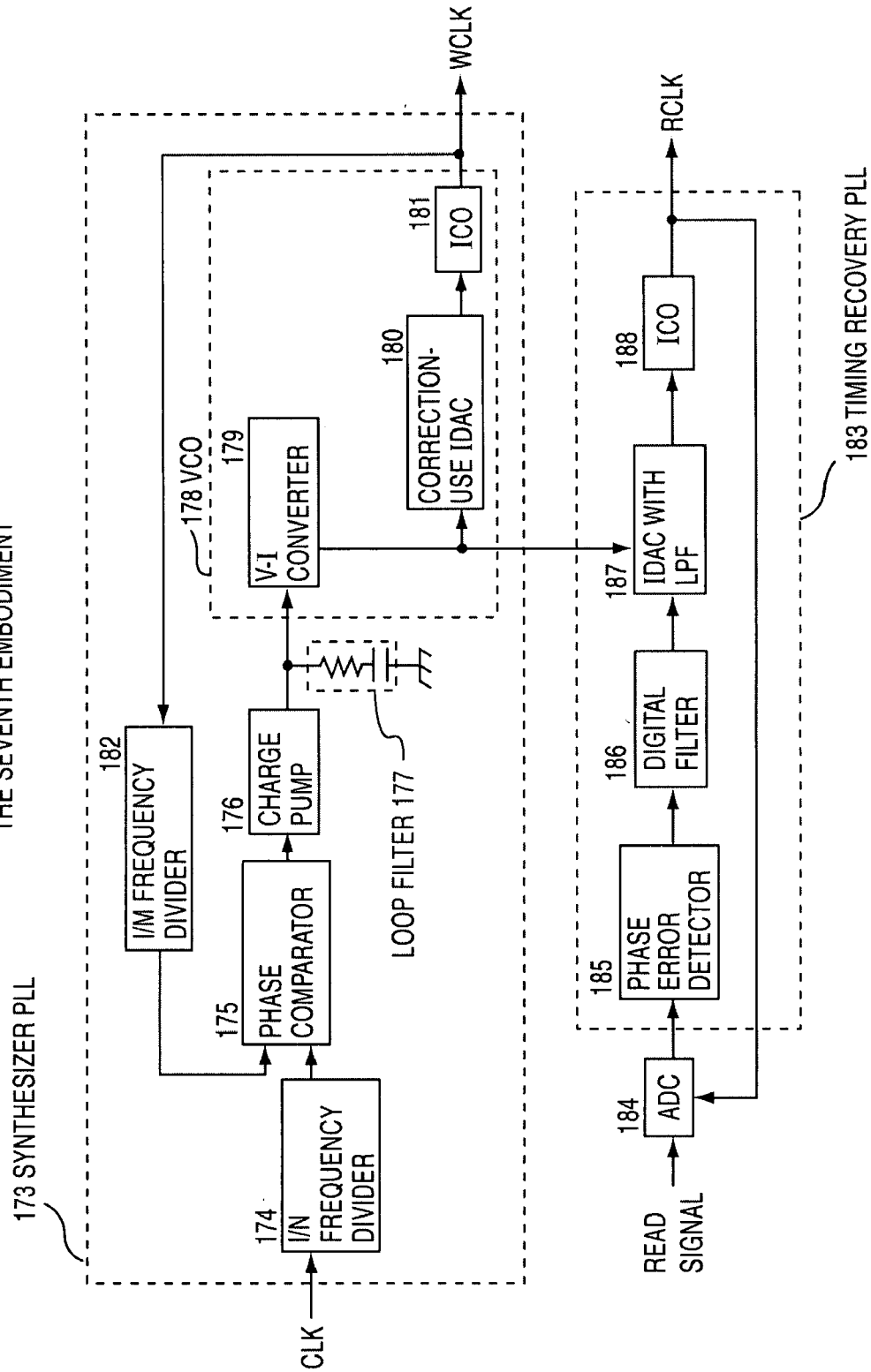

SIGNAL GENERATING CIRCUIT, TIMING RECOVERY PLL, SIGNAL GENERATING SYSTEM AND SIGNAL GENERATING METHOD

BACKGROUND OF THE INVENTION

This invention pertains to a clock recovery PLL (Phase Locked Loop) that generates a read clock for reading signals from a magnetic recording media or similar device based on the read signals read out from a magnetic recording media, optical disk or other recording media.

The clock recovery PLL generates a frequency signal (read clock) for the purpose of reading out the data that has been written to a magnetic or other media using a specific frequency signal (write clock).

In recent years, while recording media such as magnetic recording media and optical disks have made progress toward higher performance, lower costs are being sought. To lower costs, high performance LSI's, which are used in the peripherals of the recording media, have been sought.

FIG. 1 shows a traditional clock recovery PLL.

Based on the read signals read from the recording media and the write clock WCLK from the synthesizer PLL 1, the clock recovery PLL 10 generates a read clock.

The synthesizer PLL 1 is comprised of a 1/N frequency divider 2, a phase comparator 3, a charge pump 4, a loop filter 5, a voltage control oscillator 6 and a 1/M frequency divider 9.

The reference clock CLK is supplied to the 1/N frequency divider 2 and is divided 1/N times (where N is an integer) before being supplied to the phase comparator 3. At the same time, the signal that is generated by the VCO 6 is supplied to the 1/M frequency divider 9. The signal generated by the VCO 6 is divided 1/M times (where M is an integer) and is supplied to the phase comparator 3. At the phase comparator 3, the reference clock CLK, that was divided 1/N times is compared with the signal that was divided 1/M times. The compared signal is supplied to the charge pump 4 based on the compared phase error.

FIG. 2 shows an example of the phase comparator 3.

The phase comparator 3 is made up of 8 NAND circuits 20, 21, 22, 23, 24, 25, 26 and 29, the inverters 27, 28 and 31 and the AND circuit 30. A comparison is made between the reference clock (the reference clock that is divided 1/N times) and the comparison clock (the VCO 6 output signal that is divided 1/M times). Up signals and down signals, which are comparison signals, are outputted from the phase comparator based on the phase error. The up signals raise the frequency while the down signals lower the frequency.

FIG. 1 further shows the charge pump 4 supplying a signal based on the comparison signal to the loop filter 5. The loop filter 5 removes the high frequency component noise and flattens it, thereby supplying a smooth, flat signal to the VCO 6 as a return signal.

FIG. 3 shows an example of the charge pump 4. The charge pump 4 is made up of a current supply 31, PMOS transistors 32, 33, 37 and 38 as well as NMOS transistors 34, 35 and 36. The NMOS transistor 36 and the PMOS transistor 37 constitute the output stage of the charge pump 4; and they are controlled by the up signals and down signals from the phase comparator 3.

The VCO 6 is made up of a (V-I converter) voltage current converter 7 and a current control oscillator (ICO) 8.

FIG. 4 shows an example of the V-I converter 7. The V-I converter 7 is made up of an op-amp 39, a first NMOS transistor 40, a second NMOS transistor 41 and a resistor 42.

The voltage Vi of the V-I converter 7 is inputted as the op-amp 39 and the current Io is outputted from the drain of the second transistor 41. The resistance of the resistor 42 is R. The current Io that is output can be expressed by the equation Io=Vi/R. The V-I converter 7 converts the voltage signal output from the loop filter into a current signal and is outputted to ICO 8 as the control current Ic.

FIG. 5 shows an example of the ICO 8. The ICO 8 is comprised of two PMOS transistors 43 and 44, a NMOS transistor 45, three CMOS transistors 46, 47 and 48 and three inverters 49, 50 and 51. The three CMOS transistors 46, 47 and 48 and the three inverters 49, 50 and 51 constitute the ring oscillator. The control current Ic outputted from the V-I converter 7 controls the value of the current of the three CMOS transistors 46, 47 and 48 and converts the frequency of the signal that the ring oscillator generates.

In this way, the VCO 6 adjusts the frequency of the signals generated based on the return signals from the loop filter 16 and outputs the write clock WCLK.

As shown in FIG. 1, the synthesizer PLL 1 locks the write clock WCLK at its initial frequency and the locked write clock WCLK is supplied to the clock recovery PLL 10. This PLL loop is the first PLL loop.

The clock recovery PLL 10 is made up of a phase comparator 12, a phase error detector 13, a selector 14, a charge pump 15, a loop filter 16 and a VCO 17. The configurations of the phase comparator 12, the charge pump 15, the loop filter 16 and the VCO 17 are the same as that which is shown in the synthesizer PLL 1.

The clock recovery PLL 10 contains the second PLL loop, which is made up of the phase comparator 12, the selector 14, the charge pump 15, the loop filter 16 and the VCO 17, as well as the third PLL loop, which is made up of the phase error detector 13, the selector 14, the charge pump 15, the loop filter 16, the VCO 17 and an AD converter (ADC) 11.

The second PLL is the same as the first PLL loop of the synthesizer PLL 1. The second PLL Loop performs the task of locking the read clock (RCLK) that is outputted from the timing recovery PLL 10 based on the initial frequency of the write clock WCLK that the synthesizer PLL 1 outputs. After the read clock RCLK, which is outputted by the timing recovery PLL 10, has been locked to the initial frequency, the selector 14 can be used to switch the second PLL loop to the third PLL loop.

The read signal is based on the read clock RCLK that has been locked to the initial frequency and the reading out of that signal begins in the third PLL loop. The read clock RCLK corresponding to the initial frequency is taken as a sampling clock. The ADC 11 samples the read signal from the recording media. The read signal is converted to a digital signal in the ADC 11 and is supplied to the phase error detector 13. The phase error detector 13 detects errors between the read-out timing of the read signal from the recording media and the read clock RCLK corresponding to the initial frequency. The phase error signal that is outputted by the phase error detector 13 is supplied to the VCO 17 via the selector 14, the charge pump 15 and the loop filter 16. The VCO 17 is made up of the V-I converter 18 and the ICO 19 just like the VCO 6 in the synthesizer PLL 1. The VCO 17 outputs a read clock RCLK with the error adjusted based on the phase error signal. The read clock RCLK that is adjusted based on the read signal is again supplied to the ADC 11 as a sampling clock and the read signal is sampled. In the third PLL loop, the error in the timing of the read signal sampling is repeated using the read clock RCLK and the error between the read clock RCLK that was adjusted based on the previously read out read signal and the read signal that was actually read out from the recording media is detected and the read clock RCLK is adjusted. Next, a read clock RCLK is generated that conforms to the read signal that was actually read out. This is how the third PLL loop performs its role of adjusting the differences in the timing between the read clock RCLK and the read signal that is actually read out from the recording media.

In order for the traditional timing recovery PLL 10 to lock the read clock RCLK, which is output from the timing recovery PLL 10, to the initial frequency of the write clock WCLK, the first PLL loop of the synthesizer PLL 1 and the second PLL loop of the timing recovery PLL 10 are necessary. For this reason, a double PLL loop configuration must be used, which increases the scale of the circuit. Time is also required for the double PLL loops to lock on to the initial frequency (lock up time), so it takes an extremely long time for the actual reading operation to begin.

BRIEF SUMMARY OF THE INVENTION

In order to solve the problems described above, this invention provides a signal-generating circuit that generates a read-out signal that reads out a signal. Within the signal-generating circuit is a phase error detector that detects the phase error when the read-out signal is read out and outputs an error signal. The present invention also provides a converter that converts the aforementioned error signal into a signal of a specific format based on a reference signal, and a control oscillator that generates a read-out signal based on the signal having the specific format described above.

The present invention also provides a signal generation system that is equipped with a first signal generation unit that generates a first frequency signal, and a second signal generation unit that generates a second frequency signal. Within the signal generating system, the aforementioned first signal generation unit generates the first frequency signal based on a control signal, and the second signal generation unit generates the second frequency signal based on the aforementioned control signal.

The present invention further provides a signal generation circuit that generates read-out signals, which read out signals. It is equipped with a phase error detector that outputs an error signal after detecting phase error when the aforementioned signal is read out. It is equipped with a converter that converts the aforementioned error signal into a signal of a specified format based on a reference signal. It is equipped with a control oscillator that generates a read-out signal based on the aforementioned signal of a specified format.

The present invention also provides a signal generation circuit that generates a read-out signal that reads out signals. It is equipped with a first control oscillator, which generates a signal of a specific frequency based on a control signal. It is equipped with a phase error detector, which detects the phase error between the signal read-out timing and the aforementioned signal of a specific frequency or the aforementioned read-out signal. It is equipped with a converter, which converts the aforementioned error signal to a signal of a specific format based on the aforementioned control signal. It is equipped with a second control oscillator, which generates a read-out signal based on the aforementioned signal of a specific format.

The present invention provides a timing recovery PLL that generates a read-out signal, which reads out a signal recorded on recording media. It is equipped with a phase error detector that outputs an error signal after detecting a phase error between the aforementioned read-out signal and the timing of the reading out of the signal from the recording media. It is equipped with a DA converter that converts the aforementioned error signal into an analog signal based on a control signal that runs the first control oscillator, which generates a specific frequency signal. It is equipped with a second control oscillator that generates a read-out signal based on the aforementioned analog signal.

The present invention further provides a timing signal generation system equipped with a first PLL, which generates a specific frequency signal, and has a first control oscillator. It is equipped with a second PLL, which is equipped with a DA converter that converts the phase error of the read-out timing of the signal into an analog signal based on a signal that controls the aforementioned control oscillator as well as a second control oscillator, which generates a frequency signal based on said analog signal.

The present invention also provides a timing signal generation system that has a first control oscillator and a first PLL, which generates a write clock. It also has a second control oscillator and a second PLL, which generates a read clock. In this system, the aforementioned second PLL has a DA converter that converts the phase error of the read-out timing of the signal into an analog signal based on the signal that controls the aforementioned first control oscillator during the locked state and supplies said analog signal to the second control oscillator.

The present invention also provides a signal generation system equipped with a first signal generation unit, which generates a first frequency signal and a second signal generation unit, which generates a second frequency signal. In this signal generation system, the aforementioned first signal generation unit generates a first frequency signal based on a control signal and the aforementioned second signal generation unit generates a second frequency signal based on a control signal.

The present invention further provides a signal generation method wherein a signal is read out based on the read-out signal. The phase error between said read-out signal and the timing at which the signal is read out is detected and a read-out signal is generated that reads out a signal based on said signal having a specific format.

The present invention further provides a signal generation method wherein a specific frequency signal is generated based on a control signal. A signal is read out from the recording media based on the read-out signal. The phase error is detected between the read-out timing of the signal and either the aforementioned signal with the specific frequency or the read-out signal. A read-out signal is generated based on the aforementioned control signal and the aforementioned phase error.

The signal generation circuits and signal generation system of the present invention make it possible to provide a control signal, which controls the control oscillator of the signal generation circuit, which generates the write clock, as a reference signal. For this reason, there is no need for a reference signal. In other words, there is no need to generate, within the circuitry, a signal that controls the control oscillator when locking to the initial frequency. This allows the timing error at the time the signal is read out to the supplied reference signal to be added and supplied to the control oscillator. Next, the control oscillator of the signal generation circuit generates a read clock, for which the error is adjusted when the signal is read out. In this way, the signal generation circuit and the signal generation system of the present invention require no means for locking the read clock at the initial frequency nor time (lock up time) for the read clock to be locked to the initial frequency. This allows the size of the circuit to be reduced and the signal read-out time to be shortened.

Furthermore, the control signal that runs the control oscillator of the signal generation circuit that generates a write clock is taken as a reference signal and supplied to a signal generation circuit that generates a read clock. Because of this, there is no need to generate a reference signal, that is, a signal that controls the control oscillator inside the circuit itself when locking the initial frequency. This makes it possible to add the timing difference when reading out a signal to the supplied reference signal and supply it to the control oscillator. Next, the control oscillator of the signal generation circuit that generates the read clock generates the read clock with the error adjusted when reading out the signal. In this way, the signal generation circuits and the signal generation systems pertaining to this invention require no time for the lead clock to lock to the initial frequency (lock up time) or a means for locking the lead clock to the initial frequency. This makes it possible to reduce the size of the circuit and to shorten the length of the signal read-out time.

With this invention, it is particularly effective to supply a control signal that runs the VCO to the timing recovery PLL when the synthesizer PLL is in a locked state. That is, it is effective to supply a control signal that runs the VCO when locking to the initial frequency, to the IDAC or to the VDAC of the timing recovery PLL. In the IDAC or the VDAC, the control signal is treated like a reference signal and a signal, to which the phase error of the read-out timing when the signal is read has been added, is generated for this reference signal and supplied to the VCO. Based on the signal output by the IDAC or the VDAC, the VCO generates a read clock, for which the phase error at the time the signal is actually read is corrected. In this way, the timing recovery PLL requires no PLL for locking the read clock in at the initial frequency for this invention and the size of the circuit can be reduced. The signal read-out time can also be reduced by a large margin.

BRIEF DESCRIPTION OF THE DRAWINGS

FIG. 6 is a diagram showing the first Embodiment (1) of the present invention.

FIG. 17 is a diagram showing the seventh Embodiment of the present invention.

DETAILED DESCRIPTION OF THE INVENTION

The First Embodiment

Figure 7A:
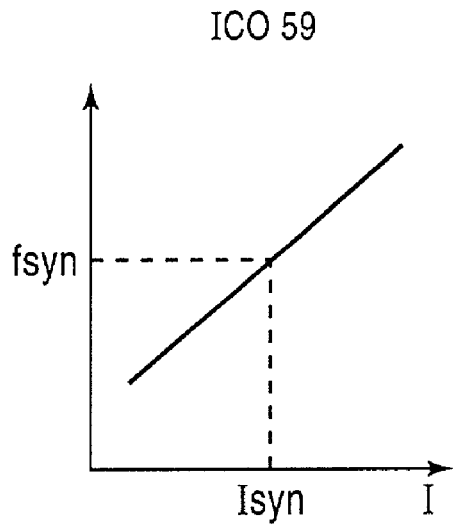
FIG. 7 is a diagram showing the first Embodiment (2) of the present invention.
Figure 7B:
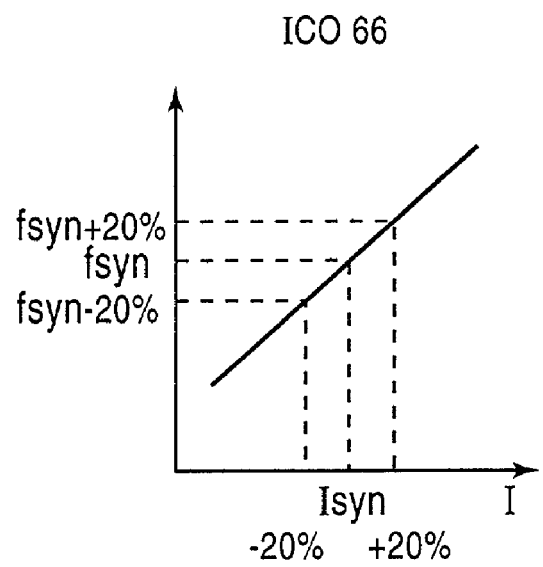
Figure 8:
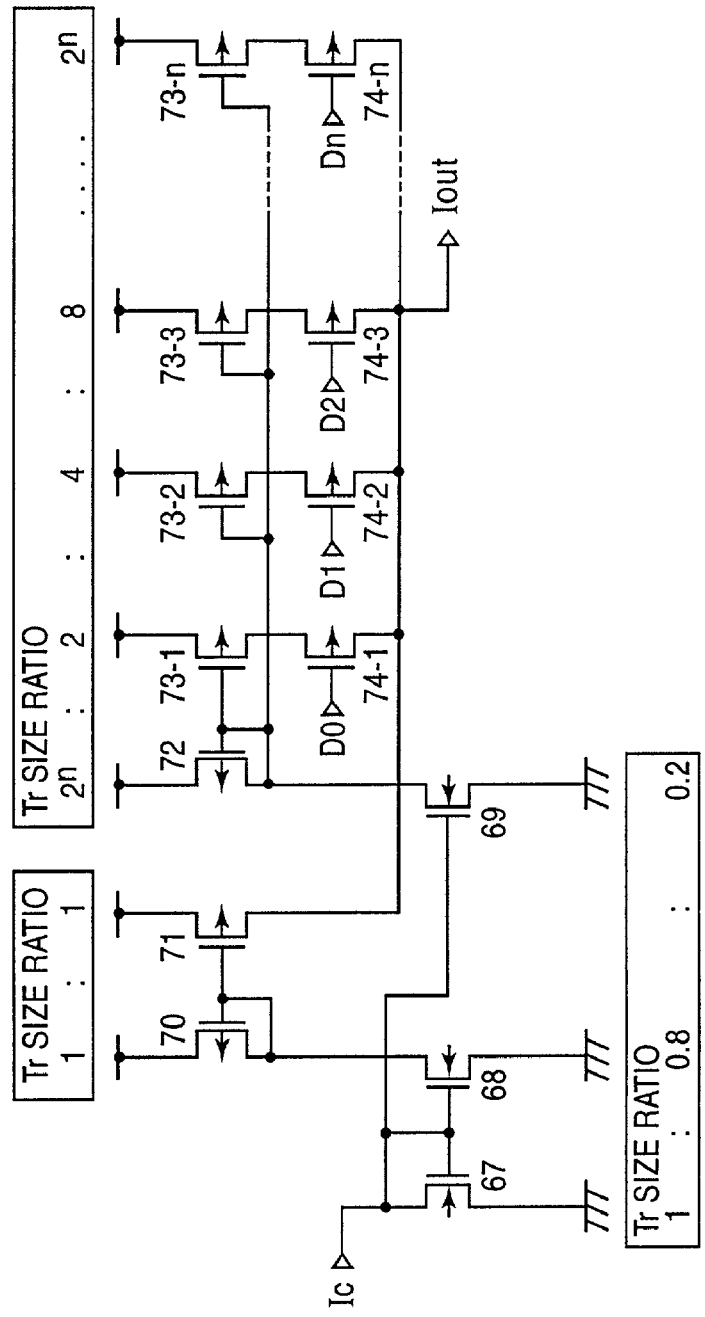
FIG. 8 is a diagram showing an example of an IDAC.

FIG. 6, FIG. 7 and FIG. 8 show the first embodiment of the present invention.

The timing recovery PLL 61 in FIG. 6 has no PLL loop for the purpose of locking the initial frequency of the write clock with the read clock that is outputted. That is, the ICO in the timing recovery PLL is controlled based on the phase error of the read signal and the signal that controls the ICO of the synthesizer PLL.

The timing recovery PLL 61, which is the first embodiment of the present invention, is made up of a phase error detector 63, a digital filter 64, a current-type DA converter (IDAC) 65 and an ICO 66. The ADC 62 is arranged in the input pre-stage of the timing recovery PLL 61.

Figure 1:
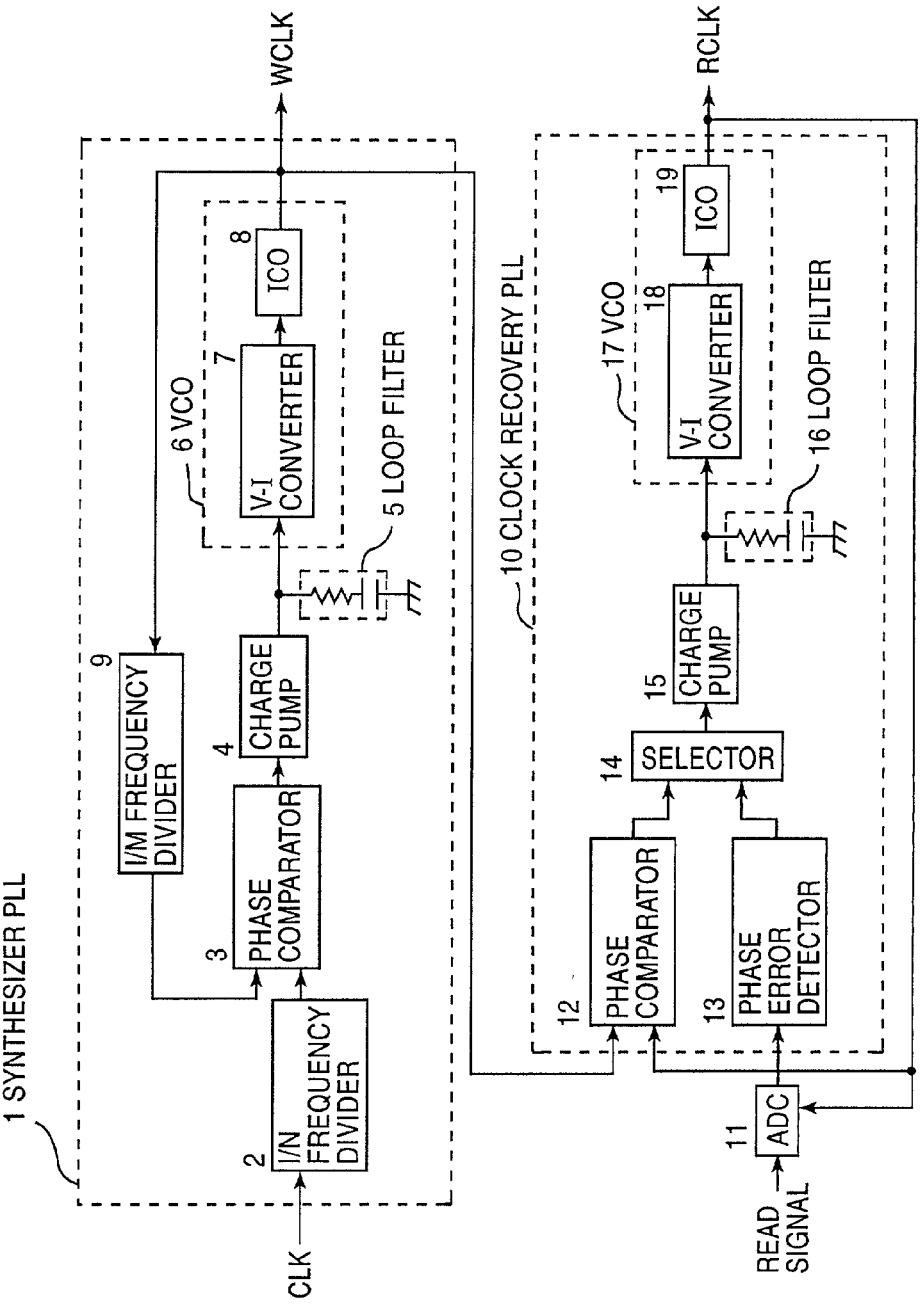
FIG. 1 is a diagram showing a traditional timing recovery PLL.
Figure 2:
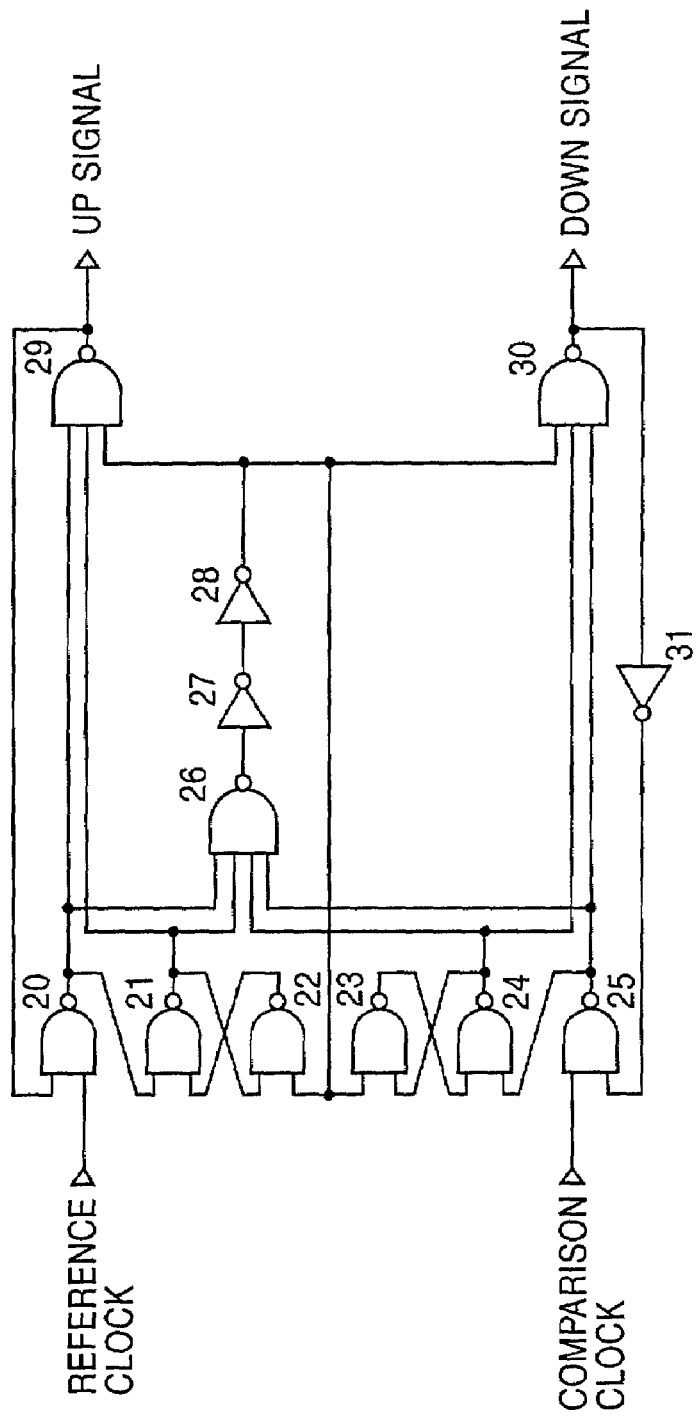
FIG. 2 is a diagram showing an example of a phase comparator.
Figure 3:
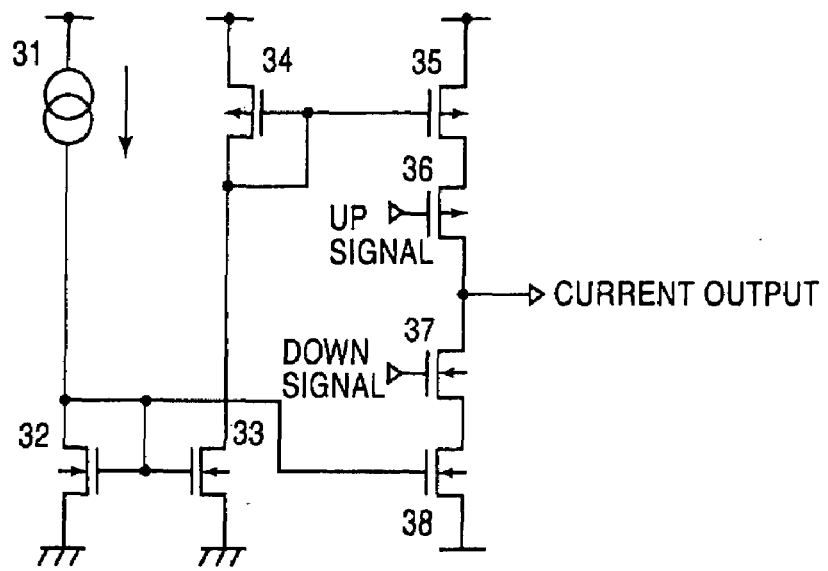
FIG. 3 is a diagram showing an example of a charge pump.
Figure 4:
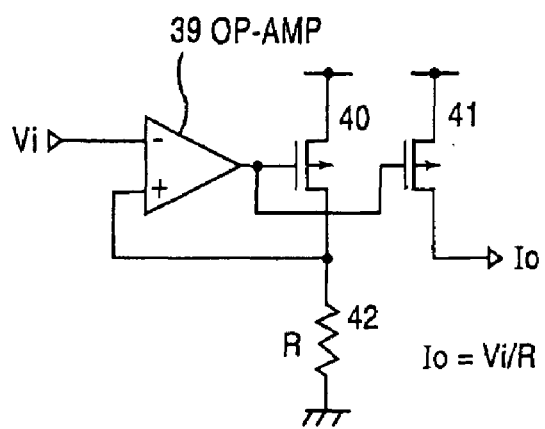
FIG. 4 is a diagram showing an example of a V-I converter.
Figure 5:
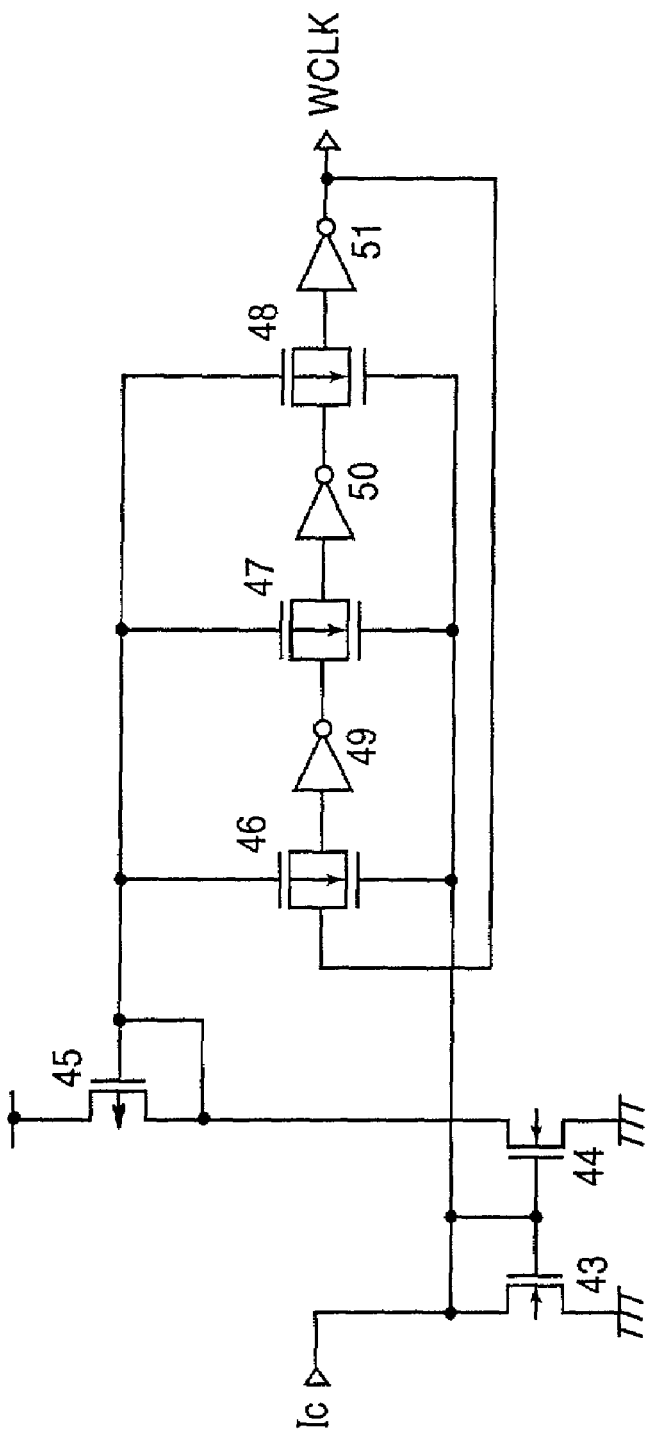
FIG. 5 is a diagram showing an example of an ICO.

The synthesizer PLL 52 is made up of the 1/N frequency divider 53, the phase comparator 54, the charge pump 55, the loop filter 56, the VCO 57 and the 1/M frequency divider 60. The VCO 57 is made up of the V-I converter 58 and the ICO 59. The configuration and functions of the synthesizer PLL 52 are the same as the synthesizer PLL 1 shown in FIG. 1. Also, the phase comparator 54, the charge pump 55, the V-I converter 58 and the ICO 59 that make up the synthesizer PLL 52 are shown in the V-I converter shown in FIG. 4 as well as the ICO shown in FIG. 5.

The synthesizer PLL 52 makes up the first PLL loop and outputs the write clock WCLK that has been locked onto the initial frequency. The V-I converter 58 supplies the control current Ic that controls the ICO 59 to the IDAC 65, Ic that controls the IDAC 65, which is in a locked state.

The ADC 62 samples the read signal from the recording media, taking the read clock RCLK as a sample lock. The read signal is converted into the digital signal using the ADC 62, and is supplied to the phase error detector 63. The phase error detector 63 detects the phase error between the read clock RCLK and the read-out timing of the actual read signal. The phase error signal from the phase error detector 63 is supplied to the IDAC 65 via the digital filter 64. Using the control current Ic as the reference current when the synthesizer PLL 52 is in a locked state, the IDAC 65 converts the phase error detection signal (which is a digital signal) into an analog signal. The ICO 66 converts the frequency based on the phase error signal that underwent analog conversion and outputs the read clock RCLK. The read clock RCLK is again supplied to the ADC 62, which is arranged at the pre-stage of the timing recovery PLL 61. Then, the ADC 62 samples the read signals using the read clock that was adjusted based on the read signal actually read out from the recording media. Accordingly, the timing recovery PLL 61 generates the read clock RCLK that conforms to the read signal based on the reference current Ic which is supplied from the synthesizer PLL 52, and the phase error between the read-out timing of the read signal and the read clock RCLK.

FIG. 7(a) shows an example of the current frequency characteristics of the ICO of the synthesizer PLL. In other words, FIG. 7(a) it shows an example of the relationship between the frequency of the signal that is generated by the ICO and the control current that is supplied to the ICO.

In FIG. 7(a), "I" indicates the control current that is output from the V-I converter and is supplied to the ICO. "I" also shows the frequency of the signal that the ICO generates. Furthermore, Isyn indicates the control current that is supplied to the ICO when the synthesizer PLL is in a locked state (taking Isyn as the reference current), and fsyn indicates the frequency that is generated when the synthesizer PLL is in a locked state (taking fsyn as the initial frequency).

FIG. 7(b) shows an example of the current frequency characteristics of the ICO with respect to the timing recovery PLL. In other words, FIG. 7(b) shows an example of the relationship between control current supplied to the ICO and the frequency of the signal generated by the ICO.

In FIG. 7(b), "I" indicates the control current supplied to the ICO from the IDAC, and "f" indicates the frequency of the signal generated by the ICO. Also, Isyn is the reference current shown in FIG. 7(a) and fsyn is the initial frequency shown in FIG. 7(a).

As an example, a read clock of the present invention is generated that conforms to the actual read signal, varying the read clock within a range of −20% to +20% with the write clock as a reference. The IDAC of the timing recovery PLL is set up so that it can control the output current of the IDAC in a range of −20% to +20%. The ICO of the synthesizer PLL and the ICO of the timing recovery PLL have the same configuration and use the same process for generating an output. For that reason, if the control current that controls the ICO of the timing recovery PLL is set up for variation within a range of −20% to +20% of the reference current, then the ICO of the timing recovery PLL will generate a frequency signal within a range of −20% to +20% of the initial frequency.

In this way, by supplying the reference current to the IDAC of the timing recovery PLL, the frequency generated by the ICO of the timing recovery PLL can be varied within a specific range with the initial frequency as a reference.

FIG. 8 shows an example of the IDAC 65 of the timing recovery PLL 61.

In FIG. 8, the IDAC 65 is made up of PMOS transistors 67, 68 and 69, and NMOS transistors 70, 71, 72, 73-1~73-n, and 74-1~74-n.

The IDAC 65 is a DA converter (DAC) with a configuration of "n" bits. It is comprised of several current sources that are made up of current mirror circuits. An analog signal corresponding to the input digital signal will be outputted by switching the current source based on the input digital signals D0, D1 . . . Dn. That is, the input digital signal D0 through Dn are supplied to the NMOS transistors 74-1~74-n. The NMOS transistors 74-1~74-n perform the switching operations and select the current supply corresponding to the input digital signal. In other words, they choose the current mirror circuit (one of the NMOS transistors from 73-1~73-n and the current mirror circuit that is made up of the NMOS transistors 72). Thereafter, the current flows from the selected current mirror circuit, and an analog signal is outputted from the output terminal Iout.

The current mirror circuit is weighted based on the ratio of the transistor sizes, such as W/L (the channel width "W" and the channel length "L") of the NMOS transistors 73-1 through 73-n. The numbers written on top of the NMOS transistors 73-1 through 73-n (2n, 2, 4 . . . 2n) indicate the weighting.

The pre-stage that is made up of the PMOS transistors 67, 68, 69 and the NMOS transistors 70 and 71 determines the range of variation for the frequencies of the read clocks (primarily the initial frequencies). As in the example described above, in order to make the ICO generate frequency signals in a range within −20% to +20% of the initial frequency, the size ratios of the PMOS transistors 67, 68 and 69 are set to 1:0.8:0.2. The size ratio of the NMOS transistors 70 and 71 is set to 1:1. These settings make it possible for the IDAC 65 pre-stage to control the ICO 66 so that frequency signals are generated in a range of −20% to +20% of the initial frequency, based on the reference current that is supplied from the synthesizer PLL 52.

The Second Example of Embodiment

Figure 9:
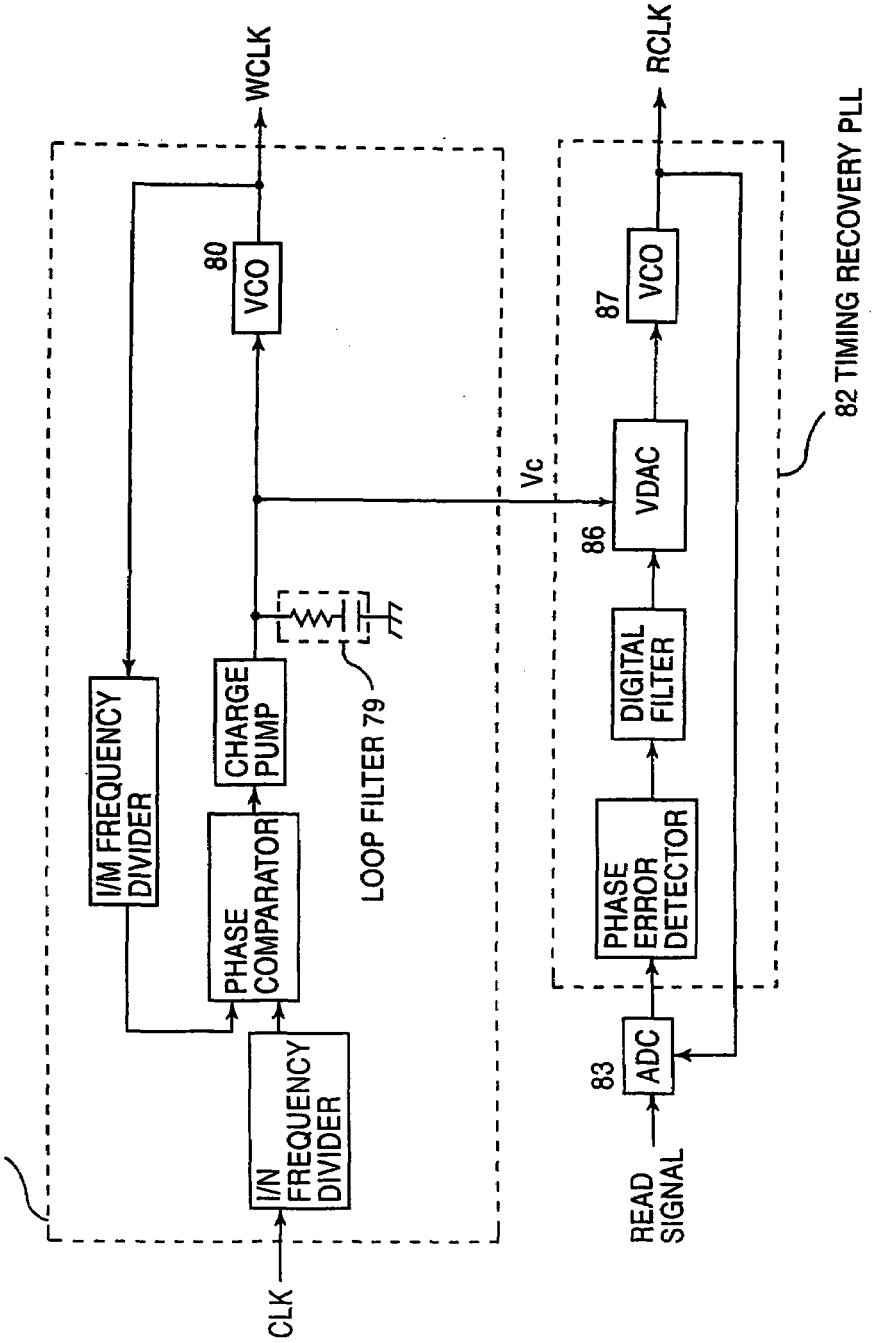
FIG. 9 is a diagram showing the second Embodiment of the present invention.

FIG. 9 shows a second embodiment of the present invention.

The second embodiment of the present invention differs from that of the first embodiment in the following ways. The current control oscillator (ICO) serves as the voltage control oscillator (VCO) and the current-type DA converter (IDAC) acts as the voltage-type DA converter (VDAC). Because a VCO is used in the second embodiment of the present invention, no V-I converter is necessary.

In FIG. 9, the timing recovery PLL has no PLL loop for locking the read clock that is outputted to the initial frequency. That is, the ICO of the timing recovery PLL is controlled based on the phase error of the read signals and the signals that control the ICO of the synthesizer PLL.

The synthesizer PLL 75 is made up of the first PLL loop and it outputs the write clock WCLK that is locked to the initial frequency. The loop filter 79 supplies the control voltage Vc that controls the VCO 80 when in a locked state to the VDAC 86 as a reference voltage. The VDAC 86 takes the reference voltage Vc as a reference and converts the digital phase error signal into an analog signal. The VCO 87 varies the frequency based on the phase error signal and outputs the read clock RCLK. The read clock RCLK is again supplied to the ADC 83, which is arranged at the pre-stage of the timing recovery PLL 82. Then, the ADC 83 samples the read signal using the read clock that was adjusted using the read signal actually read out from the recording media. In this way, the timing recovery PLL 82 generates a read clock RCLK that conforms to the read signal based on the detection of the phase error between the read clock RCLK and the read-out timing of the read signal, in the same way as the first embodiment of this invention.

Figure 10:
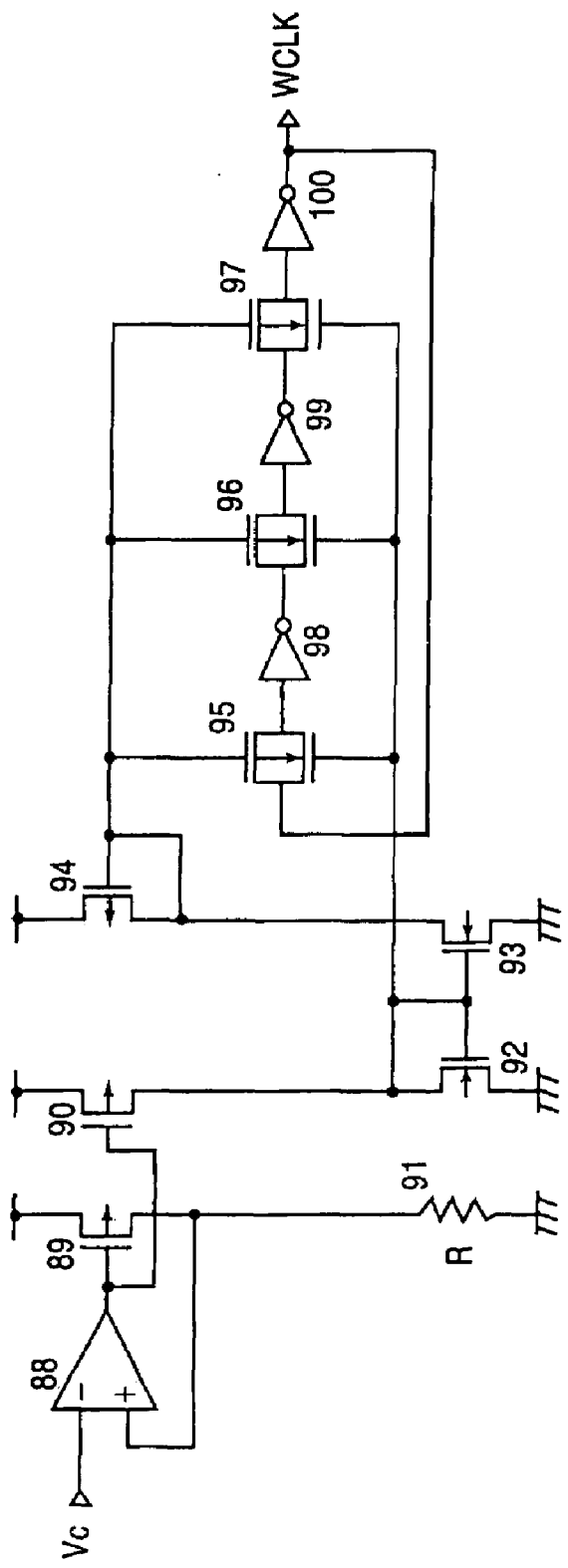
FIG. 10 is a diagram showing an example of a VCO.

FIG. 10 shows an example of the VCO 80 and 87. The VCO 80 and 87 is made up of an op-amp 88, three NMOS transistors, 89, 90 and 94, two PMOS transistors 92 and 93, resistor 91, three CMOS transistors 95, 96 and 97, and three inverters 98, 99 and 100. The three CMOS transistors 95, 96 and 97 and three inverters 98, 99 and 100 make up the ring oscillator. The control voltage Vc outputted from the loop filter 79 varies and adjusts the frequency of the signals generated by the ring oscillator by controlling the resistance value of the three CMOS transistors 95, 96 and 97.

Accordingly, the VCO 80 generates the write clock WCLK by adjusting the frequency of the signals generated based on the return signals from the loop filter 79.

Figure 11:
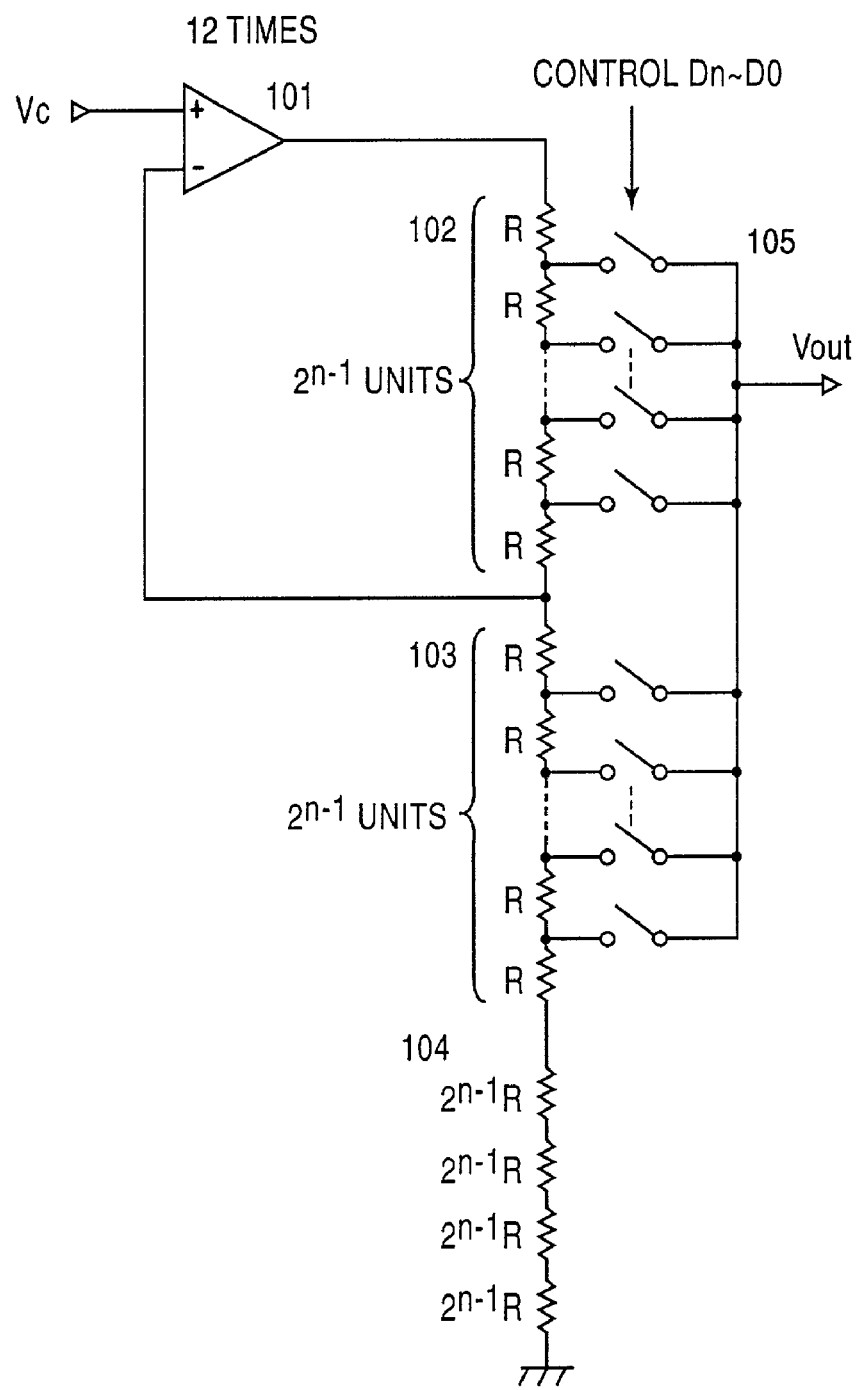
FIG. 11 is a diagram showing an example of a VDAC.

FIG. 11 shows an example of the VDAC 86 of the timing recovery PLL 82.

In FIG. 11, the VDAC 86 is made up of an op-amp 101, resistors 102, 103 and 104 and a set of switches 105.

The VDAC 86 is a DA converter configured with "n" bits. It controls the switches based on the input digital signals D0, D1 . . . Dn and it outputs an analog signal corresponding to the input digital signal.

In the VDAC 86, the op-amp gain determines the range (with a concentration on the initial frequencies) in which the read clock frequency will be varied. In the example described above, the gain of the op-amp 86 would be set to 1.2 times when generating a frequency signal in a range that is −20% to +20% of the initial frequency from the VCO 87. This setting would cause the VCO 87 to generate a frequency signal in a range that is −20% to +20% of the initial frequency based on the reference current supplied from the synthesizer PLL 75.

The Third Embodiment

Figure 12:
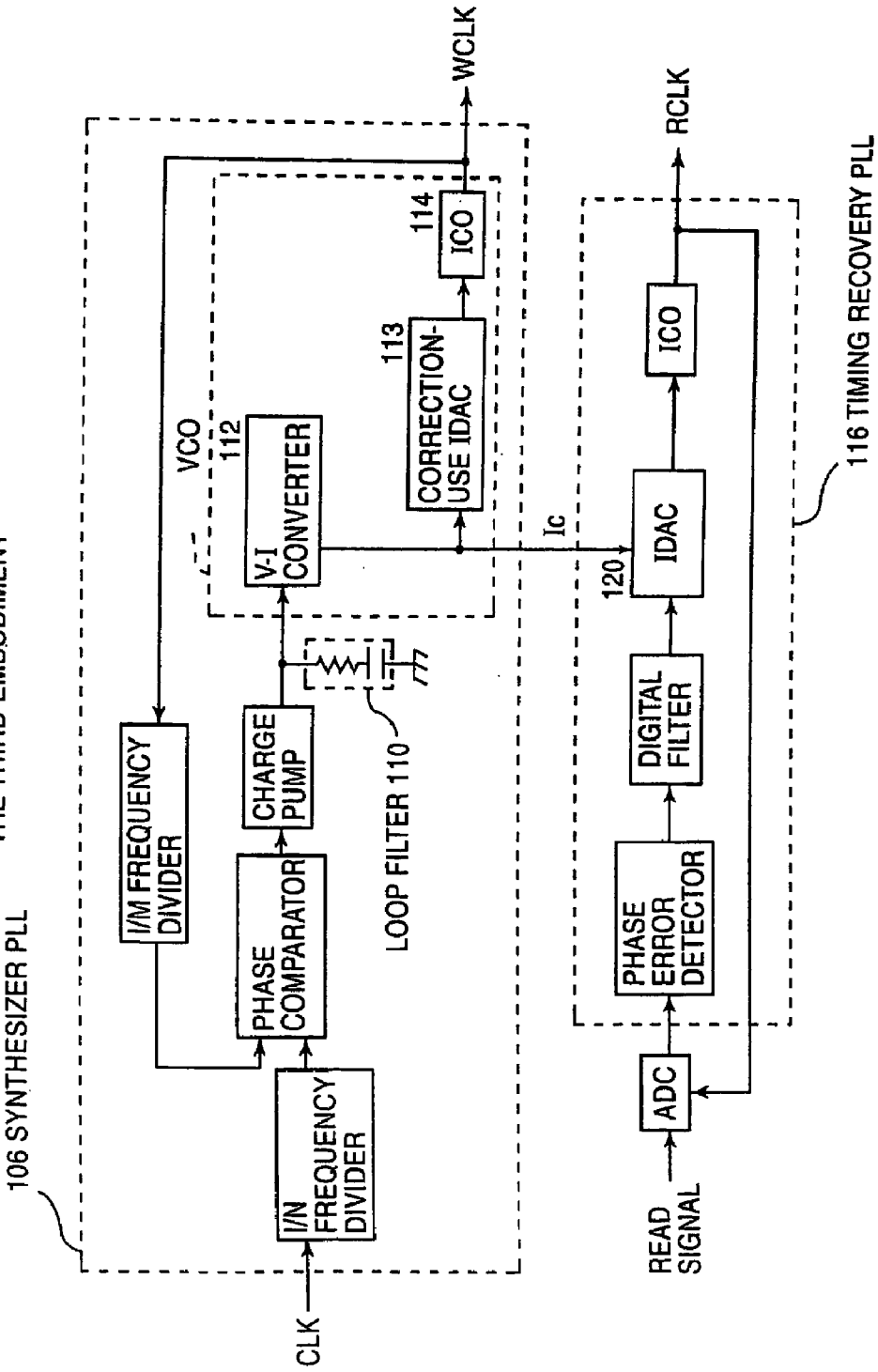
FIG. 12 is a diagram showing the third Embodiment of the present invention.

FIG. 12 shows the third embodiment of the present invention. The difference between the third embodiment of the present invention and the first embodiment is that the VCO in the synthesizer PLL has an IDAC for making corrections.

The synthesizer PLL generates a specific write clock according to the design settings in a locked state. However, due to variations in the manufacturing process, there are times when the specified write clock cannot be generated. For this reason, it takes time for the timing recovery PLL to draw the read clock into the read signal. Also, when the error is significant, it is possible that the read clock will not be drawn into the read signal.

For this reason, the correction-use IDAC 113 has been inserted between the ICO 114 and the V-I converter 112 of the synthesizer PLL 106 in order to correct the control current that runs the ICO. The correction-use IDAC 113 could, for example, be controlled by a controller not featured in the diagram and supply a control current Ic to the ICO 114 that had been error corrected due to variations in manufacturing. This sort of error correction makes it possible for the synthesizer PLL 106 to generate the desired write clock WCLK. For the IDAC 120 of the timing recovery PLL 116, the control current Ic is supplied during the generation of the desired write clock, and therefore it would be possible to generate a read clock, that conformed to the read signal in the timing recovery PLL 116.

Moreover, the timing recovery PLL 106 in the third embodiment of the present invention would not have a PLL loop for the purpose of locking the read clock RCLK into the initial frequency.

The Fourth Embodiment

Figure 13:
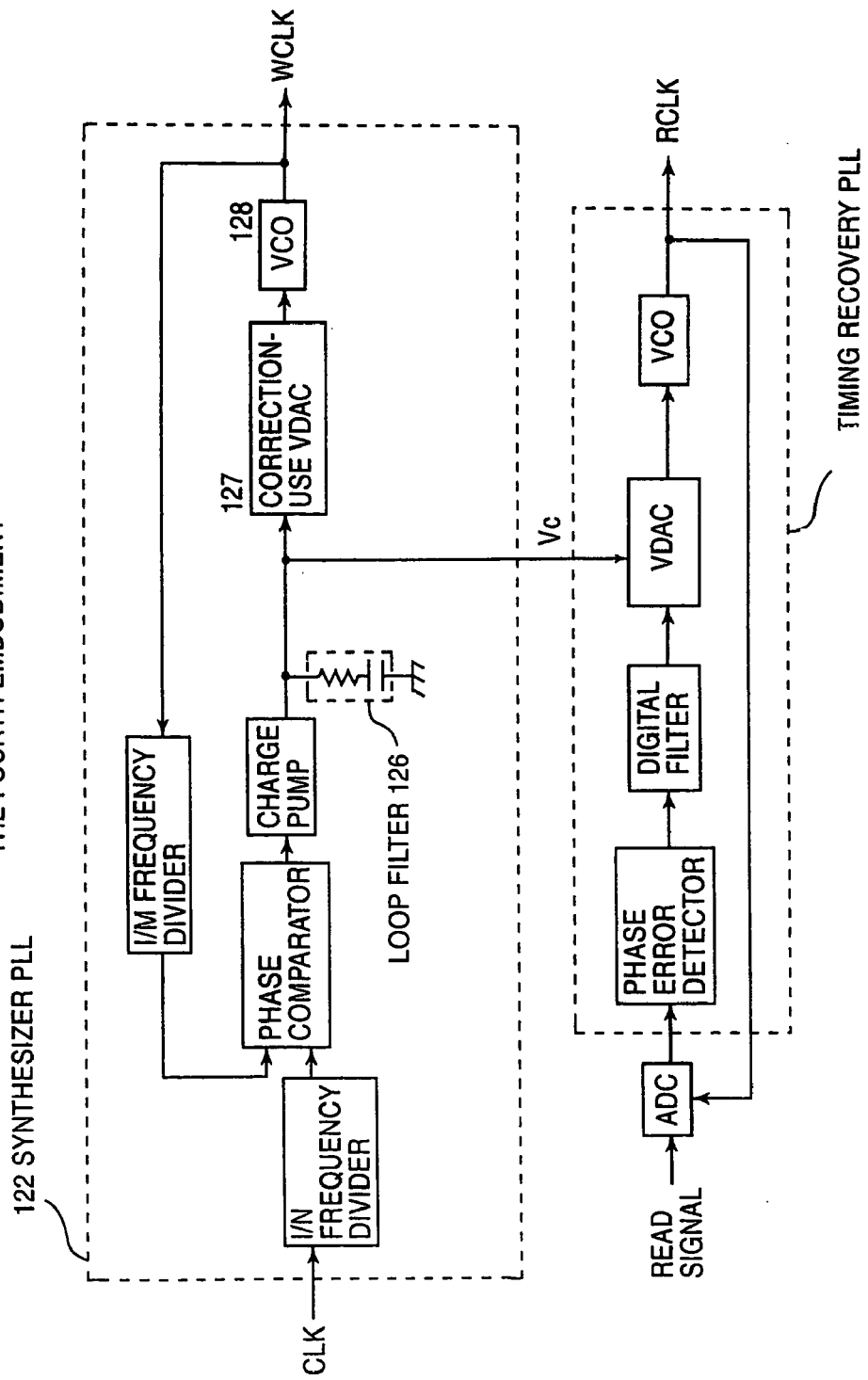
FIG. 13 is a diagram showing the fourth Embodiment of the present invention.

FIG. 13 shows the fourth embodiment of the present invention. As for the fourth embodiment of the present invention, the VCO of the synthesizer PLL contains a correction-use VDAC just like the third embodiment and is in contrast with the second embodiment of the present invention. As for the synthesizer PLL 122, the correction-use VDAC 127, which corrects the control current that runs the VCO, is inserted between the loop filter 126 and the VCO 128. The reason for inserting a correction-use VDAC and its function are the same as for the third embodiment of the present invention.

Furthermore, the timing recovery PLL 122 found in the fourth embodiment would not have a PLL loop for the purpose of locking the read clock RCLK into the initial frequency.

The Fifth Embodiment

Figure 14:
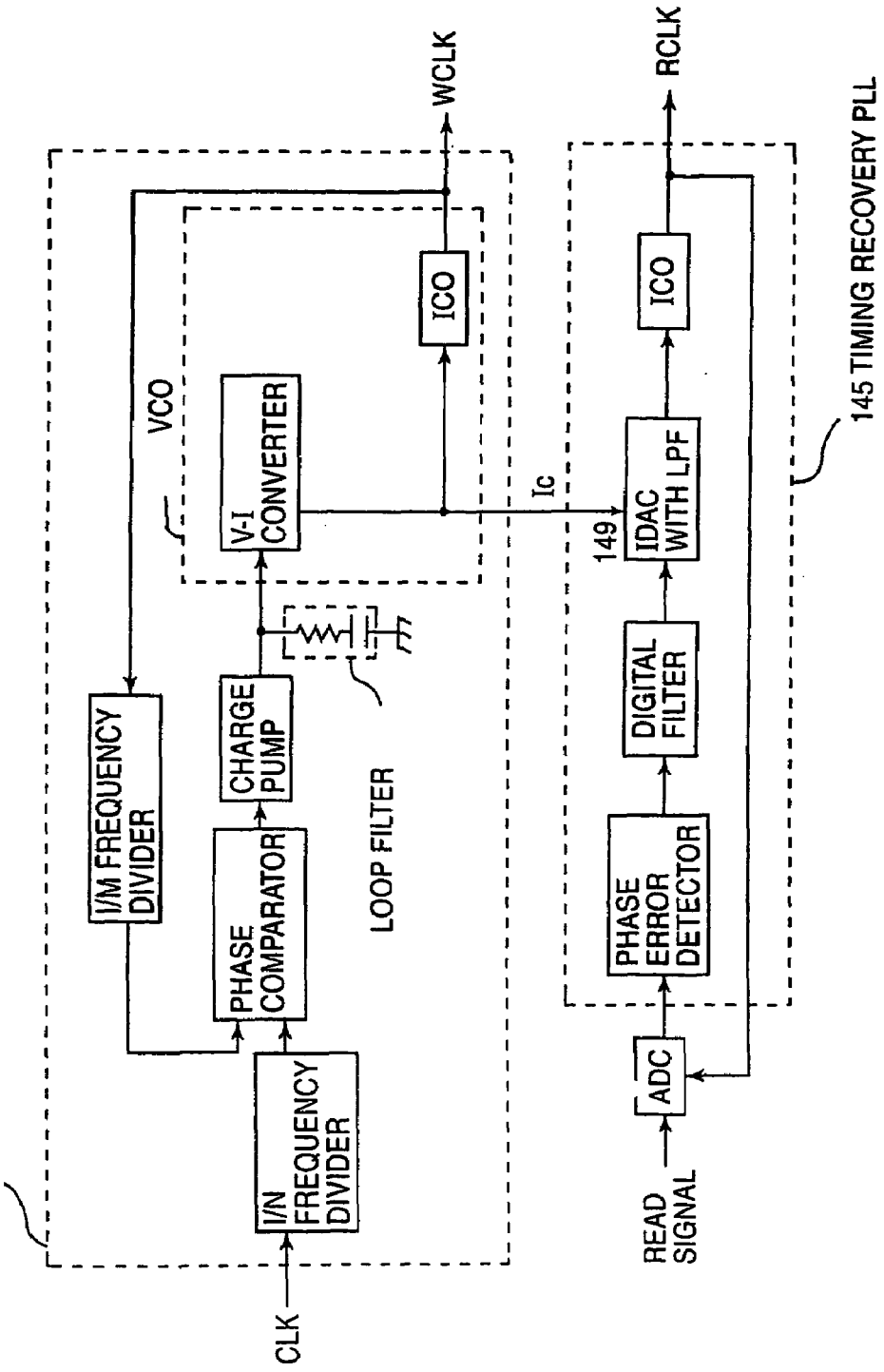
FIG. 14 is a diagram showing the fifth Embodiment of the present invention.

FIG. 14 shows the fifth embodiment of the present invention. The difference between the third embodiment of the present invention and the first embodiment is that the IDAC of the timing recovery PLL comes with a Low Pass Filter (LPF) attached.

In the IDAC, there are times when glitches (noise) will be generated in the output current when the input data changes. If these glitches are supplied to the ICO, then the ICO will output a high frequency signal that conforms to the glitch. This would then cause the timing recovery PLL to come out of its licked state, which could mean not being able to maintain the desired frequencies.

For this reason, the IDAC was replaced with the IDAC 149, which comes with an LPF attached. The IDAC 149 with LPF works to control the output current. Because the IDAC 149, with LPF controls the output current when glitches occur it is possible to control the lack of stability in the timing recovery PLL caused by high frequency signals.

Moreover, the timing recovery PLL 145 in the fourth embodiment of the present invention would not have a PLL loop for the purpose of locking the read clock RCLK into the initial frequency.

Figure 15:
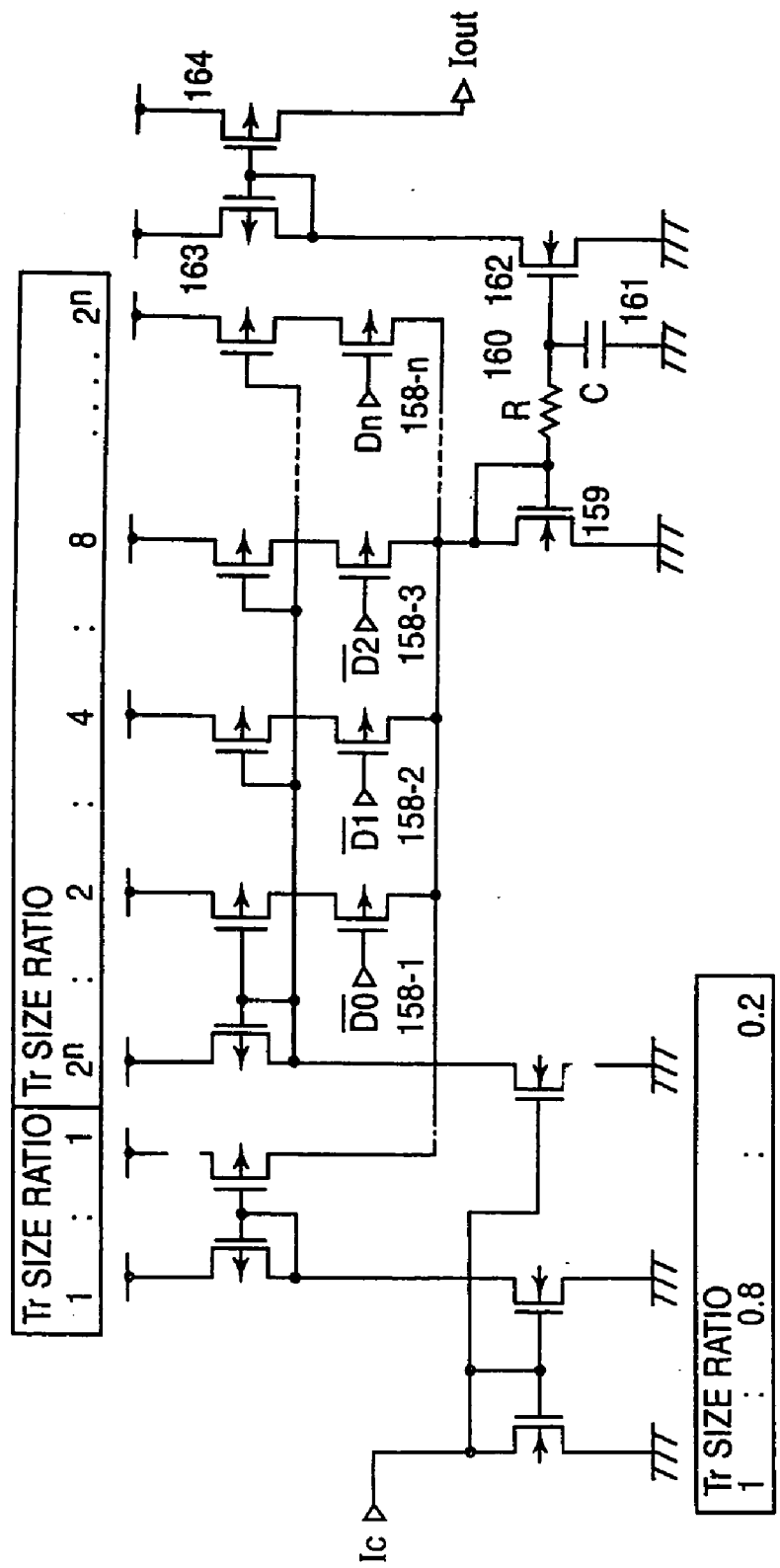
FIG. 15 is a diagram showing an example of an IDAC with an LPF attached.

FIG. 15 shows an example of the IDAC 149 with LPF in the timing recovery PLL 145.

In FIG. 15, the IDAC 149 with the LPF uses almost the same configuration as that of the IDAC shown in FIG. 8, and the current output module is equipped with the LPF configured with the PMOS transistors 159 and 162, the resistor 160, the condenser 161 and the NMOS transistors 163 and 164.

Furthermore, the functions are the same as that of the IDAC shown in FIG. 8 with the exception that the LPF functions to control the output current.

The Sixth Embodiment

Figure 16:
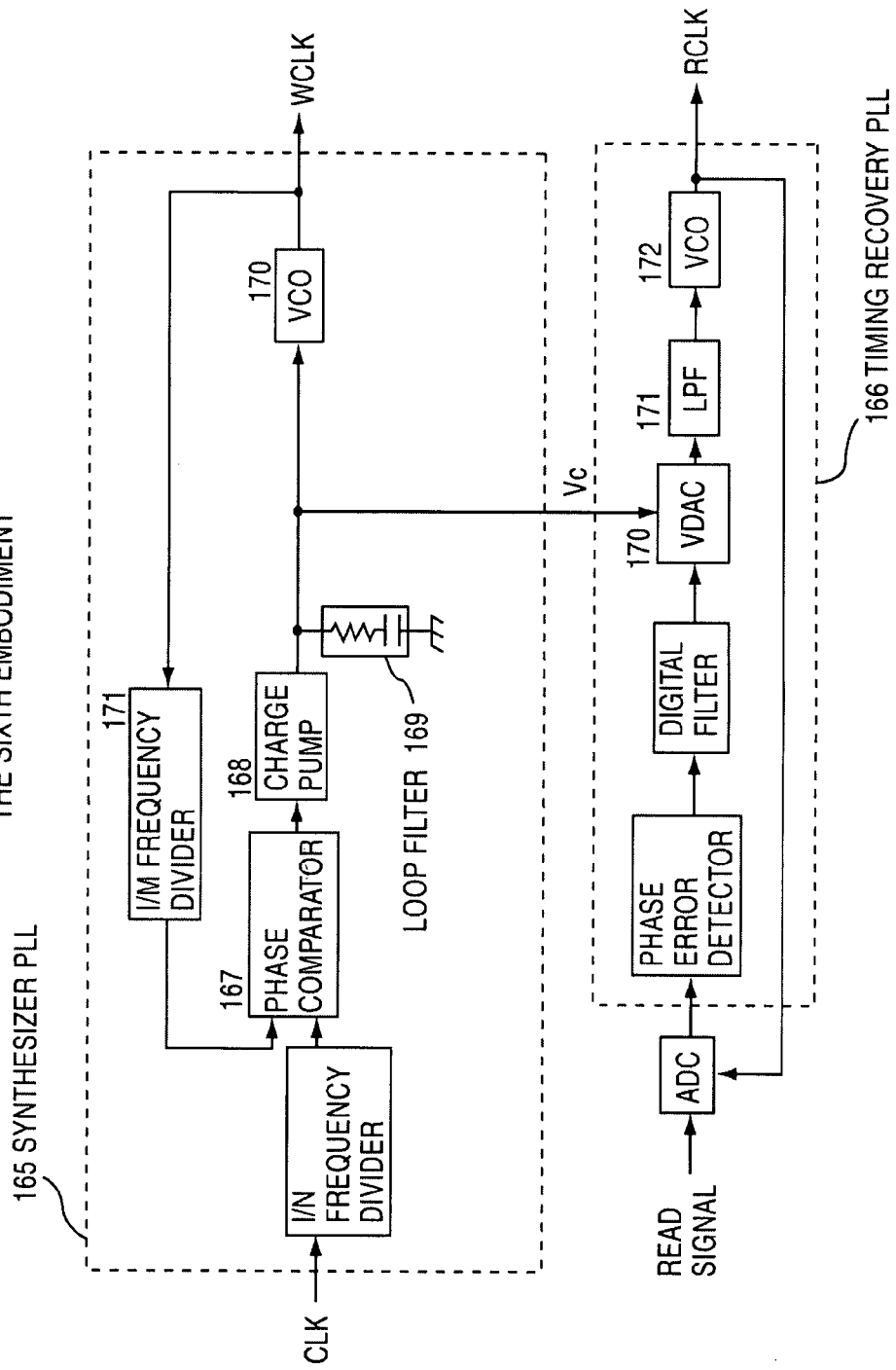
FIG. 16 is a diagram showing the sixth Embodiment of the present invention.

FIG. 16 shows the sixth embodiment of the present invention. In the sixth embodiment of the present invention, an LPF function was added to the output of the VDAC as descried in the fifth embodiment above, and is in contrast to the second embodiment of the present invention.

In the timing recovery PLL 166, the LPF 171 is inserted between the VDAC 170 and the VCO 172. The reason for inserting the LPF 171 and its function are the same as in the fifth embodiment of the present invention.

Moreover, the timing recovery PLL 166 in the sixth embodiment of the present invention would not have a PLL loop for the purpose of locking the read clock RCLK into the initial frequency.

The Seventh Embodiment

FIG. 17 shows the seventh embodiment of the present invention. The third embodiment of the present invention and the fifth embodiment of the present invention have been combined to form the seventh embodiment of the present invention.

For the synthesizer PLL 173, the correction-use IDAC 180, which corrects the control current that runs the ICO, is inserted between the loop filter 177 and the ICO 181. The reason for using the correction-use IDAC 180 and its functions are the same as that of the third embodiment of the present invention.

For the timing recovery PLL 183, the IDAC 187 with an LPF attached is used. The reason for using the IDAC 187 with LPF attached and their functions are the same as that of the fifth embodiment of the present invention.

The timing recovery PLL 183 in the seventh embodiment of the present invention would not have a PLL loop for the purpose of locking the read clock RCLK into the initial frequency.

The invention claimed is:

1. A signal generation system comprising:
   a first PLL with a first control oscillator that generates a specific frequency signal;
   a DA converter that converts a read timing phase error into an analog signal based on a control signal that controls the first control oscillator;
   a second PLL with a second control oscillator that generates a frequency signal based on said analog signal; and
   a correction DA converter wherein said correction DA converter corrects said control signal and supplies the corrected control signal to the first control oscillator.

2. The signal generation system according to claim 1, wherein the DA converter is a DA converter with a low pass filter function.

3. The signal generation system according to claim 1, wherein the DA converter includes a unit for determining the range of a frequency signal that is generated by the second control oscillator.

4. The signal generation system according to claim 1, wherein the control signal is outputted when the first PLL locks.

5. A timing signal generation system comprising:
   a first PLL with a first control oscillator which generates a write clock;
   a second PLL with a second control oscillator which generates a read clock and converts a read timing phase error signal into an analog signal based on a control signal that controls a first control oscillator during a lock state;
   a DA converter unit that supplies said analog signal to the second control oscillator; and
   a correction DA converter wherein the correction DA converter corrects said control signal and supplies the corrected control signal to the first control oscillator.

6. The time signal generation system according to claim 5, wherein the DA converter unit is a DA converter unit with a low pass filter function.

7. The time signal generation system according to claim 5, wherein the DA converter unit includes a unit for determining the range of frequency signals generated by said second control oscillator.

8. The signal generation system comprising:
   a first signal generation unit that generates a first frequency signal; and
   a second signal generation unit that generates a second frequency signal,
   wherein the first signal generation unit generates the first frequency signal based on a first signal, the first signal being generated by correcting a second signal via a correction DA converter, and
   wherein the second signal generation unit generates the second frequency signal by supplying the second signal to a DA converter.

9. The signal generation system according to claim 8, wherein the first signal generation unit is a synthesizer PLL and supplies the first control signal to the second signal generation unit during a locked state.

10. The signal generation system according to claim 8, further comprising:
    an AD converter unit that samples signals.

11. A signal generation method comprising the steps of:
    generating a specific frequency signal based on a first signal, the first signal being generating by correcting a second signal via a correction DA converter;
    reading a signal from a recording media based on a read-out signal;
    reading a signal from a recording media based on a read-out signal;
    detecting a phase difference between the specific frequency signal and the read-out signal; and
    generating said read-out signal by supplying the phase difference to a DA converter that is controlled by the second signal.

* * * * *